US006225827B1

(12) United States Patent
Fujii et al.

(10) Patent No.: US 6,225,827 B1
(45) Date of Patent: May 1, 2001

(54) DYNAMIC LOGIC CIRCUIT AND SELF-TIMED PIPELINED DATAPATH SYSTEM

(75) Inventors: Koji Fujii; Takakuni Douseki, both of Tokyo (JP)

(73) Assignee: Nippon Telegraph & Telephone Corporation, Tokyo (JP)

( * ) Notice: Subject to any disclaimer, the term of this patent is extended or adjusted under 35 U.S.C. 154(b) by 0 days.

(21) Appl. No.: 09/033,913

(22) Filed: Mar. 3, 1998

(30) Foreign Application Priority Data

Mar. 3, 1997 (JP) .................................... 9-061735

(51) Int. Cl.[7] .............................................. H03K 19/096
(52) U.S. Cl. ................................. 326/98; 326/93
(58) Field of Search ................. 326/98, 93, 97, 326/120, 121, 17, 112, 86, 119, 83

(56) References Cited

U.S. PATENT DOCUMENTS

| 4,435,658 | * | 3/1984 | Murray et al. ........................ 327/76 |
| 4,859,873 | * | 8/1989 | O'Shaughnessy et al. ............ 327/74 |
| 5,486,774 |   | 1/1996 | Shinichirou et al. . |
| 5,675,527 | * | 10/1997 | Yano ................................... 364/760 |
| 5,754,068 | * | 5/1998 | Kumagai ............................. 327/142 |
| 5,821,769 | * | 10/1998 | Douseki .............................. 326/34 |
| 5,831,451 | * | 11/1998 | Bosshart ............................. 326/93 |

FOREIGN PATENT DOCUMENTS 0 820 147    1/1998    (EP) .

OTHER PUBLICATIONS

Furber et al., "Dynamic Logic in Four–Phase Micropipelines", 1996 IEEE , pp. 11–16, Jun. 1996.*
Komori et al. "An Elastic Pipeline Mechanism by Self-–Timed Circuits", IEEE Journal of Solid–State Circuits, vol. 23, No. 1, pp 111–117, Feb 1988.*
Renoudin et al. "A New Asynchronous Pipeline Scheme: Application to the Design of a Self–Timed Ring Divider", IEEE Journal of Solid–State Circuits, vol. 31, No. 7, pp 10111013, Jul. 1996.*
Jan M. Rabaey, "Timing Issues In Digital Circuits", in Digital Integrated Circuits, Prentice Hall, 1996, Chapter 9, pp. 522–533.
R. Krambeck et al., "High–Speed Compact Circuits with CMOS", IEEE Journal of Solid–State Circuits, vol. SC–17, No. 3, Jun. 1982, pp. 614–619.
N. Goncalves et al., "NORA: A Racefree Dynamic CMOS Technique for Pipelined Logic Structures", IEEE Journal of Solid–State Circuits, vol. SC–18, No. 3, Jun. 1983, pp. 261–266.
G.M. Jacobs et al., "A Fully Asynchronous Digital Signal Processor Using Self–Timed Circuits", IEEE Journal of Solid–State Circuits, vol. 25, No. 6, Dec. 1990, pp. 1526–1537.

(List continued on next page.)

Primary Examiner—Michael Tokar
Assistant Examiner—James H. Cho
(74) Attorney, Agent, or Firm—Venable; Norman N. Kunitz

(57) ABSTRACT

A dynamic logic circuit comprising a plurality of unit dynamic logic circuits sequentially coupled in a multiple-stage fashion, each of which unit dynamic logic circuits including: a logic circuit portion formed by one or more than one MOS transistors; a first MOS transistor for a precharging or a pre-discharging operation with respect to the logic circuit; and a second MOS transistor to enable the logic circuit a discharging or a charging operation; wherein the MOS transistors composing the logic circuit portion are configured by low-threshold MOS transistors; and the second MOS transistor to enable the discharging or charging operation is composed of a high-threshold MOS transistor. The dynamic circuit is applied to a plural stage of combinational circuits in a self-timed pipelined datapath system, whereby a static leakage current at charging or pre-discharging operation can be reduced, resulting in decrease of power dissipation.

19 Claims, 15 Drawing Sheets

OTHER PUBLICATIONS

Maitham Shams et al., "A Comparison of CMOS Implementations of an Asynchronous Circuits Primitive: the C–Element", 1996, pp. 1–4.

F. Assaderaghi et al., "A Dynamic Threshold Voltage MOSFET (DTMOS) for Ultra–Low Voltage Operation", 1994, pp. 33.1.1–33.1.4.

* cited by examiner

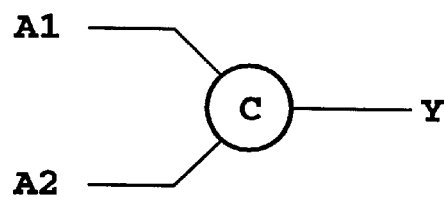
*FIG.11A*
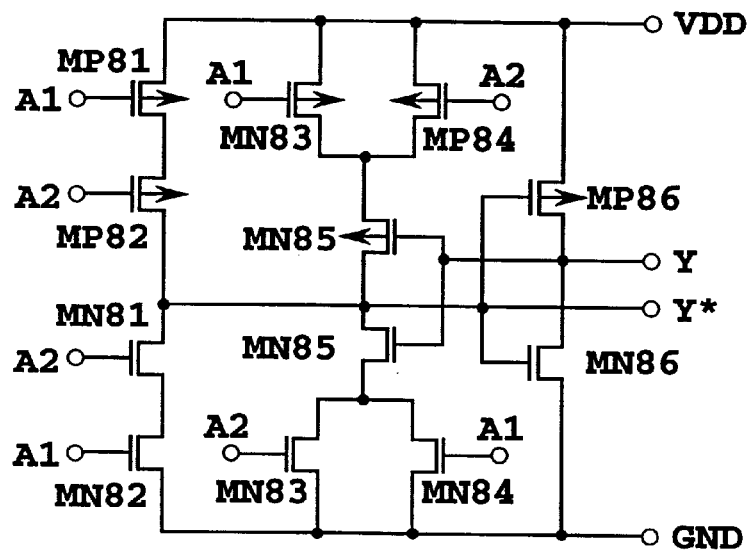
*FIG.11B*
| A1 | A2 | Y |
|---|---|---|
| 0 | 0 | 0 |
| 0 | 1 | Y |
| 1 | 0 | Y |
| 1 | 1 | 1 |
*FIG.11C*

US 6,225,827 B1

DYNAMIC LOGIC CIRCUIT AND SELF-TIMED PIPELINED DATAPATH SYSTEM

This application is based on Patent Application Ser. No. 061,735/1997 filed Mar. 3, 1997 in Japan, the content of which is incorporated hereinto by reference.

BACKGROUND OF THE INVENTION

1. Field of the Invention

The present invention relates to a dynamic logic circuit such as a DOMINO logic circuit and a npCMOS logic circuit capable of reducing the static leakage current in its inactive state, and also relates to a self-timed pipelined datapath system which adopts a plurality of combinational circuits therein formed by these dynamic circuits, and controls the active and inactive states thereof along with the data flowing order in response to asynchronous signals.

2. Description of the Related Art

Recently, the LSI circuits installed on communication equipment, for example, battery-operated portable communication devices dissipate more power with an increasing amount of information to be handled on them.

To address this problem, various techniques for lowering power dissipation have been researched and developed. As one example of such a conventional method, a self-timed pipelined datapath system as shown in FIGS. 10 and 12 has been proposed to solve a large power dissipation problem caused by a distribution of clock signals and simultaneously choreographing a huge number of events that take place in a large-scale synchronous system (Jan M. Rabaey, "TIMING ISSUES IN DIGITAL CIRCUITS" in DIGITAL INTEGRATED CIRCUITS, Prentice Hall, 1996).

In the self-timed pipelined datapath system shown in FIG. 10, write enable signals EN1 through EN3 to be applied to registers REG1 through REG3, respectively connected to combinational circuits 11' and 12', are generated in accordance with the state of data processing operation within the respective combinational circuits 11' and 12'. For this reason, a conventional problem of the passing through of unprocessed data due to a clockskew phenomenon can be efficiently avoided, and the same effect can be obtained by a configuration of the self-timed pipelined datapath system shown in FIG. 12. Furthermore, such self-timed pipelined datapath systems are quite effective for reducing power dissipation, as the combinational circuits adopted therein are activated and the issue of signals occurrs only on the arrival of data thereto. Note that the wording "issue" means a state change of a signal from "0" to "1" throughout the specification.

There have been proposed for use as dynamic circuits for the above-mentioned combinational circuits a DOMINO logic circuit (R. Krambeck et al., "High-Speed Compact Circuits with CMOS, "IEEE journal of Solid State Circuits, vol.SSC-17, no.3, pp. 614–619, June 1992) and npCMOS circuit (N. Goncalvez et al., NORA:A Racefree Dynamic CMOS Technique for Pipelined Logic Structures, "IEEE Journal of Solid State Circuits, vol. SSC-18, no.3, pp.261–266, June 1983).

In a DOMINO logic circuit as shown in FIG. 9A, nMOS transistors MN51 and MN52 configure a pull-down network 51, and an nMOS transistor MN55 also configures a pull-down network 53. MP51 and MP52 are pMOS transistors for a precharging operation, and MN53 and MN56 are NMOS transistors for a discharging operation. pMOS transistor MP53 and NMOS transistor MN54 configure a CMOS inverter 52, which transfers the data obtained by the pull-down network 51 at the preceding stage to the pull-down network 53 at the succeeding stage.

In the DOMINO logic circuit as shown above, when the controlling signal ST1 is "0" (meaning the low voltage level throughout the specification), the transistors MP51 and MP52 perform a precharging operation, whereas when it becomes "1" (meaning the high voltage level throughout the specification), a logic operation (sampling operation) is performed.

In a DOMINO logic circuit as shown in FIG. 9B, pMOS transistors MP62 and MP63 configure a pull-up network 61, a pMOS transistor MP66 also configures a pull-up network 63. MP61 and MP65 are pMOS transistors for charging operation, MN61 and MN63 are nMOS transistors for a pre-discharging operation. PMOS transistor MP64 and nMOS transistor MN62 configure a CMOS inverter 62, which transfers the data obtained by the pull-up network 61 at the preceding stage to the pull-up network 63 at the succeeding stage.

In this DOMINO logic circuit, when the controlling signal ST1* (which is an inverted ST1 signal) is "1", a pre-discharging operation is performed by transistors MN61 and MN63, whereas when it becomes "0", a logic operation is performed.

In an npCMOS logic circuit as show in FIG. 9C, pMOS transistors MP72 and MP73 configure a pull-up network 71, an nMOS transistor MN72 configures a pull-down network 72. MP71 is a pMOS transistor for a charging operation, MP74 is a pMOS transistor for a precharging operation, MN71 is a nMOS transistor for a pre-discharging operation and MN73 is a nMOS transistor for a discharging operation.

In this npCMOS logic circuit, when the controlling signal ST1* is "1" (meaning that the ST1 signal is "0"), a pre-discharging operation is performed by the transistors MN71 and a precharging operation is performed by the transistor MP74, whereas when it becomes "0" (meaning that the ST1 becomes "1"), a logic operation is executed.

However, in the case of low supply voltage, if these dynamic circuits are adopted as the combinational circuits in the self-timed pipelined datapath system, and if the MOS transistors composing each of the dynamic circuits have low-threshold voltages so as to comply with the low supply voltage and to accelerate thereof operating speed thereof, a static leakage current is generated when the dynamic circuit is in an inactive state, namely, in a precharging or pre-discharging state. for phenomenon causes power dissipation in the system.

SUMMARY OF THE INVENTION

The present invention has been designed to solve the above-described problem, and thus, an object of the present invention is to provide a system which is capable of accelerating an operating speed of the dynamic logic circuit, while reducing the static leakage current at its precharging and pre-discharging states, which occupy the greatest part of operations performed in the entire circuit, so as to reduce the power dissipation.

In order to solve the aforementioned problems, a dynamic logic circuit according to a first embodiment of the present invention is constructed such that each of a plurality of unit dynamic logic circuits sequentially coupled in multi-stage fashion to construct a dynamic logic circuit includes: a logic circuit portion which is a pull-down network composed of one or more low-threshold nMOS transistors; a pMOS transistor for a precharging operation; and a high-threshold nMOS transistor for a discharging operation, wherein the plurality of unit dynamic logic circuits are configured as a DOMINO logic circuit by disposing a low-threshold CMOS inverter between the unit dynamic logic circuit at a preceding stage and the unit dynamic logic circuit at a succeeding stage.

A dynamic logic circuit according to a second embodiment of the present invention is constructed such that each of the plurality of unit dynamic logic circuits used in the dynamic logic circuit includes: a logic circuit portion which is a pull-up network composed of one or more low-threshold pMOS transistors; an nMOS transistor for a pre-discharging operation; and a high-threshold pMOS transistor for a charging operation, wherein the plurality of unit dynamic logic circuits are configured as a DOMINO logic circuit by disposing a low-threshold CMOS inverter between the unit dynamic logic circuit at a preceding stage and the unit dynamic logic circuit at a succeeding stage.

A dynamic logic circuit according to a third embodiment of the present invention is constructed such that each of the plurality of unit dynamic logic circuits used in the dynamic logic circuit comprises: a first unit dynamic logic circuit and a second unit dynamic logic circuit; wherein the first unit dynamic logic circuit includes; a logic circuit portion which is a pull-up network composed of low-threshold pMOS transistors; an nMOS transistor for a pre-discharging operation; and a high-threshold pMOS transistor for a charging operation; and the second unit dynamic logic circuit includes: a logic circuit portion which is a pull-down network composed of low-threshold nMOS transistors; a pMOS transistor for a precharging operation; and a high-threshold nMOS transistor for a used in operation; and wherein the plurality of unit dynamic logic circuits are configured as an npCMOS logic circuit by interconnecting the first unit dynamic logic circuit and the second unit dynamic logic circuit.

A self-timed pipelined datapath system according to a fourth embodiment of the present invention is constructed such that it comprises: a pipelined datapath circuit including a plurality of data processing stages, each having: a combinational circuit for processing input data, each of the plurality of combinational circuits having a dynamic logic circuit comprising a plurality of sequentially coupled unit dynamic logic circuits, and a register connected to the input side of the combinational circuit; and an asynchronous signal control circuit that controls each of the registers in the pipelined datapath circuit in response to a request signal; wherein each of the plurality of unit dynamic logic circuits further comprises: a logic circuit portion formed by one or more low-threshold MOS transistors; a first MOS transistor for a precharging or a pre-discharging operation with respect to the logic circuit; and a second high-threshold MOS transistor to enable a discharging or a charging operation; for the logic circuit wherein the asynchronous signal control circuit comprises: a circuit generating the activation signal for controlling precharging and discharging operations and/or pre-discharging and charging operations of the combinational circuit in response to the request signal.

A self-timed pipelined datapath system based on a two-phase handshaking protocol according to a fifth embodiment of the present invention is constructed in a similar way to that of the self-timed pipelined datapath system according to the above fourth embodiment, except that the registers adopted therein are double edge-triggered flip-flops.

As is explained above, according to the dynamic logic circuits of the present invention, even in a case where it is used with low-threshold MOS transistors at a low supply voltage in order to achieve both low power and high speed operation, the leakage current in an inactive state, such as precharging and/or pre-discharging, which occupy the most part of operations performed in the entire circuit, can be reduced, thus contributing to an effective reduction in power dissipation. Further, according to the self-timed pipelined datapath system, precharging and discharging and/or pre-discharging and charging operations of the dynamic logic circuit can be controlled in accordance with the data flowing order. This also contributes greatly to the reduction of power dissipation.

The above and other objects, effects, features and advantages of the present invention will become apparent from the following description of embodiments thereof taken in conjunction with the accompanying drawings.

BRIEF DESCRIPTION OF THE DRAWINGS

FIG. 11A is a symbolic diagram of the C-element, FIG. 11B is a circuit diagram of the C-element, and FIG. 11C is an explanatory view of a truth table of the C-element;

DETAILED DESCRIPTION OF THE PREFERRED EMBODIMENTS (First Embodiment)

Figure 1:
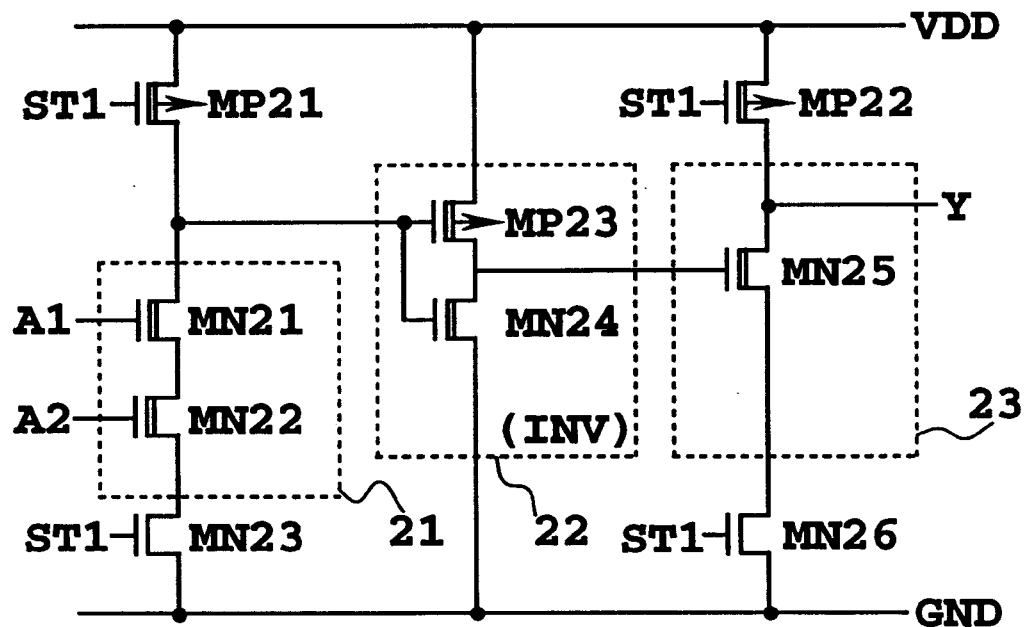
FIG. 1 is a circuit diagram showing a DOMINO logic circuit as a first embodiment according to the present invention.

FIG. 1 is a circuit diagram showing a configuration of the DOMINO logic circuit, which is a dynamic logic circuit according to the first embodiment of the present invention.

In the figure, reference numerals MP21 and MP22 are high-threshold or low-threshold pMOS transistors for precharging operation, and MN23 and MN26 are high-threshold nMOS transistors for discharging operation. Further, MN 21 and MN22 are low-threshold nMOS transistors constituting a pull-down network 21. MN25 is also a low-threshold nMOS transistor constituting a pull-down network 23. MP23 is a low-threshold pMOS transistor, and MN24 is a low-threshold nMOS transistor, together constituting an inverter 22 for transmitting the data obtained by the preceding-stage pull-down network 21 to the succeeding-stage pull-down network 23.

In the DOMINO logic circuit, when the controlling signal ST1 is "0", the transistors MP21 and MP22 are on, and the transistors MN23 and MN26 are off, so that a precharging operation is performed to the drains (more precisely parasitic capacitances) of MN21 and M25. When the controlling signal ST1 becomes "1", the transistors MP21 and MP22 are off, and the transistors M23 and MN26 are on to perform a logic operation.

In this case above, if the input data A1 and A2 are both "1" at the preceding-stage pull-down network 21, a NAND operation is executed to change the voltage at the drain of the transistor MN21 from "1" to "0" by discharging the capacitance thereof. Since this data "0" is inverted at the inverter 22 and inputted to the succeeding-stage pull-down network 23, the output data Y is changed from "1" to "0". However, if at least one of the input data A1 and A2 is "0", then the output data from the pull-down network 21 is not changed from "1", and the output data Y remains to be "1" unchanged.

In this circuit, as the pull-down networks 21, 23 and the inverter 22 are all formed by low-threshold MOS transistors, even if a low supply voltage VDD is used, a high-speed dynamic operation can be realized. Furthermore, as the transistors MN23 and MN26 for a discharging operation have high-threshold voltage, a leakage current of these transistors MN23 and MN26 at the precharging state of the circuit is extremely low, so that a power dissipation during its precharging operation, which occupies the greatest part of operations performed in the entire circuit, is greatly reduced.

(Second Embodiment)

Figure 2:
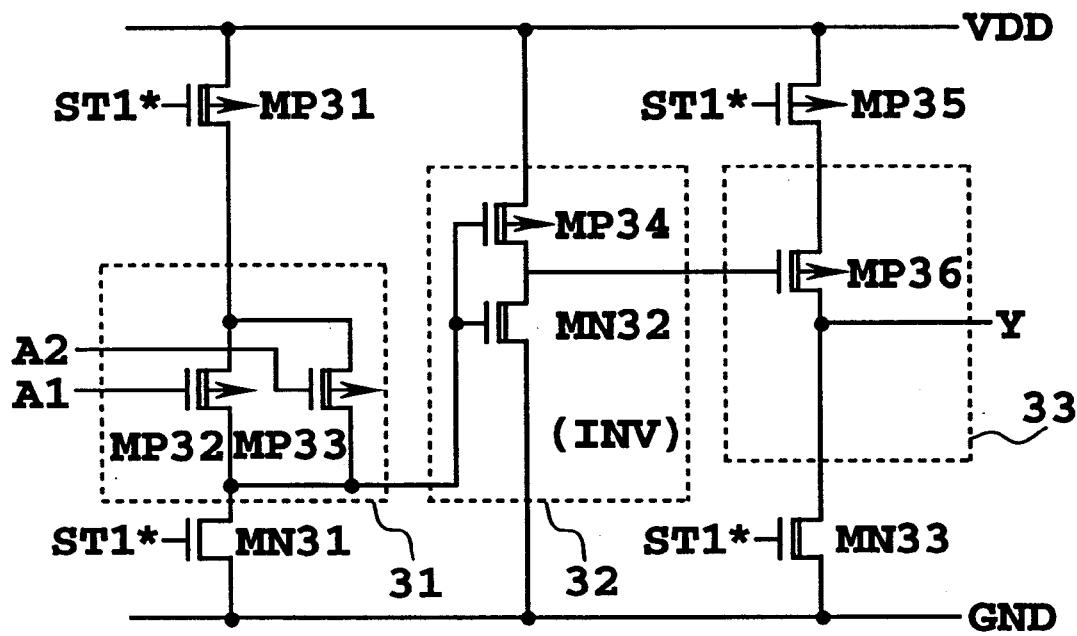
FIG. 2 is a circuit diagram showing a DOMINO logic circuit as a second embodiment according to the present invention.

FIG. 2 is a circuit diagram showing a configuration of the DOMINO logic circuit, which is a dynamic logic circuit according to a second embodiment of the present invention. In the figure, reference numerals MP31 and MP35 are high-threshold pMOS transistors for charging operation, and MN31 and MN33 are high-threshold or low-threshold nMOS transistors for pre-discharging operation. Further, MP32 and MP33 are low-threshold pMOS transistors constituting a pull-up network 31. MP36 is also a low-threshold pMOS transistor constituting a pull-up network 33. MP34 is a low-threshold pMOS transistor, and MN32 is a low-threshold nMOS transistor, configuring together an inverter 32 for transmitting the data obtained at the preceding-stage pull-up network 31 to the succeeding-stage pull-up network 33.

In the DOMINO logic circuit, when the controlling signal ST1 is "0" (meaning that the controlling signal ST1 * is "1"), the transistors MN31 and MN33 are on, and the transistors MP31 and MP35 are off, so that it performs pre-discharging operation to the drain of the respective transistors MP32 and MP33 and also to that of MP36. When, on the contrary, the ST1 signal becomes "1", the transistors MN31 and MN33 are off, and the transistors MP31 and MP35 are on to perform a logic operation.

In this case above, if the input data A1 and A2 are both "1" at the preceding-stage pull-up network 31, a NAND operation is executed to hold the voltage "0" at the drain of the respective transistors MP32 and MP33. Since this data "0" is inverted at the inverter 32 and inputted to the succeeding-stage pull-up network 33, the output data Y remains unchanged from the "0" state. However, if at least one of the input data A1 and A2 is "0", then the output data from the pull-up network 31 is changed to "1", and the output data Y is thus changed from "0" to "1".

In this circuit, as the pull-up networks 31, 33 and the inverter 32 are all formed by low-threshold MOS transistors, even if a low supply voltage VDD is used, a high-speed dynamic operation can be realized. Furthermore, as the MP31 and MP35 for charging operation have high-threshold voltage, a leakage current of these transistors MP31 and MP35 at the pre-discharging state of the circuit is significantly decreased, so that a power dissipation during its pre-discharging operation, which occupies the greatest part of operations performed in the entire circuit, is greatly reduced.

(Third Embodiment)

Figure 3:
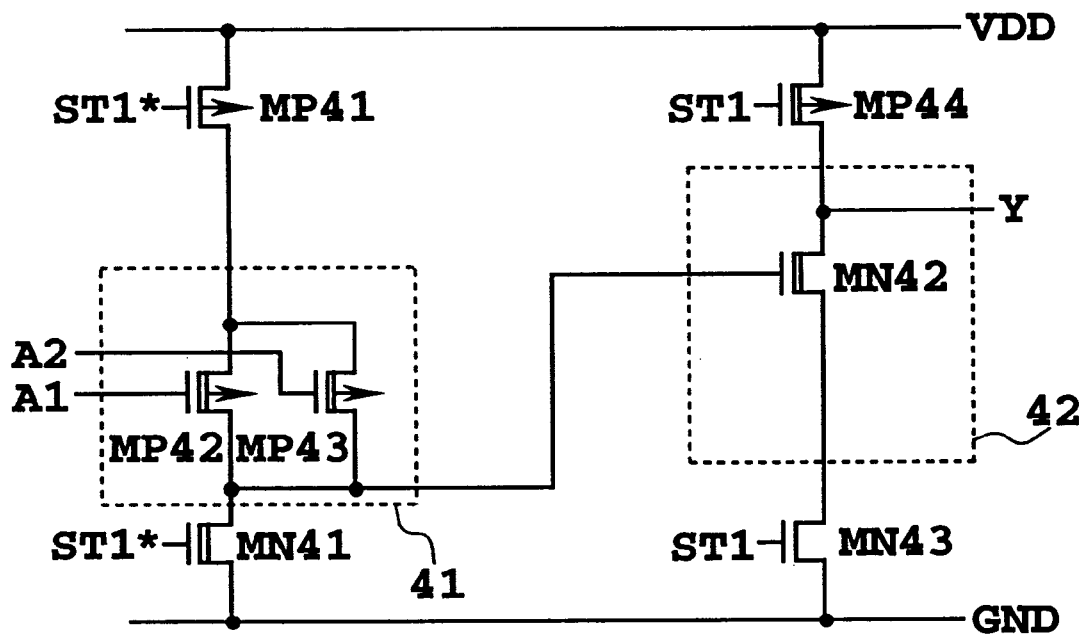
FIG. 3 is a circuit diagram showing an npCMOS logic circuit as a third embodiment according to the present invention.

FIG. 3 is a circuit diagram showing a configuration of the npCMOS logic circuit, which is a dynamic logic circuit according to a further embodiment of the invention. In the figure, reference numeral MP41 is a high-threshold pMOS transistor for charging operation, MP44 is a high-threshold or low-threshold pMOS transistor for precharging operation, MN41 is a high-threshold or low-threshold nMOS transistor for pre-discharging operation, and MN43 is a high-threshold NMOS transistor for discharging operation. Further, MP42 and MP43 are low-threshold pMOS transistors constituting a pull-up network 41. MN42 is a low-threshold NMOS transistor constituting a pull-down network 42.

In the npCMOS logic circuit, when the controlling signal ST1 is "0" (meaning that the controlling signal ST1 * is "1"), the transistors MN41 and MP44 are on, and the transistors MP41 and MN43 are off, so that a pre-discharging operation to the drain of the respective transistors MP42 and MP43, and also a precharging operation to the drain of the transistor MN42, are performed. When, on the contrary, the ST1 signal becomes "1", the transistors MN41 and MP44 are off, and the transistors MP41 and MN43 are on to perform a logic operation.

In this case above, if the input data A1 and A2 are both "1" at the preceding-stage pull-up network 41, a NAND operation is executed to hold the voltage "0" at the drain of the respective transistors MP42 and MP43. Since this data "0" is inputted to the succeeding-stage pull-down network 42, the output data Y remains unchanged from the "1" state. However, if at least one of the input data A1 and A2 is "0", then the output data from the pull-up network 41 is changed from "0" to "1", and the output data Y is thus changed from "1" to "0".

In this circuit, as the pull-up network 41 and the pull-down network 42 are both formed by low-threshold MOS transistors, even if a low supply voltage VDD is used, a high-speed dynamic operation can be realized. Furthermore, as the transistor MP41 for a charging operation and the transistor MN43 for a discharging operation have high-threshold voltage, a leakage current of these transistors MP41 and MN43 at the respective pre-discharging and precharging states of the circuit is significantly reduced, so that a power dissipation during the respective pre-discharging and precharging operations, which occupy the greatest part of operations performed in the entire circuit, is greatly reduced.

(Fourth Embodiment)

Figure 4:
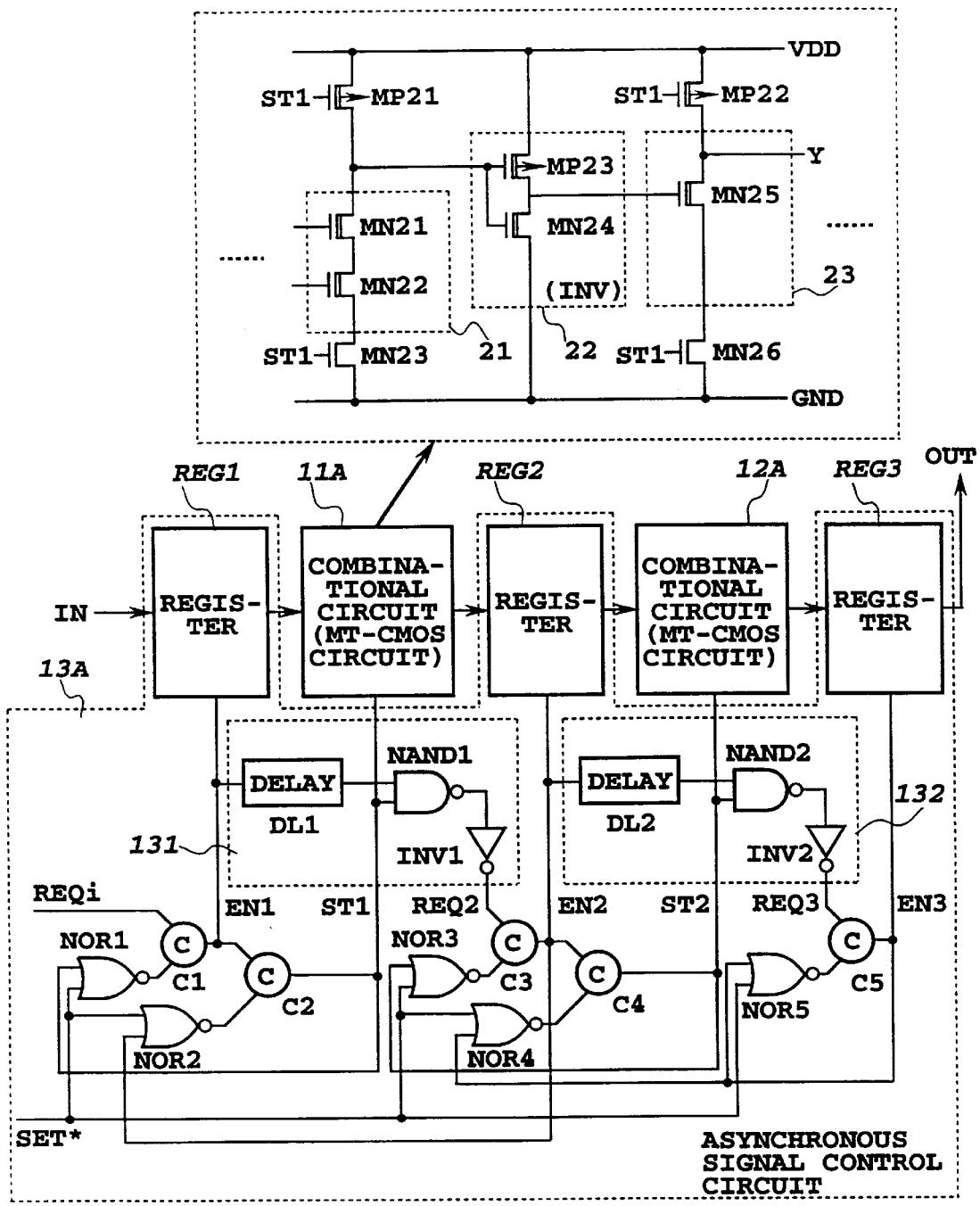
FIG. 4 is a circuit diagram showing a self-timed pipelined datapath system as a fourth embodiment according to the present invention.

FIG. 4 is a circuit diagram showing a configuration of the self-timed pipelined datapath system according to a fourth embodiment of the present invention. In the figure, reference numeral 11A denotes a first-stage combinational circuit adopting the dynamic logic circuit shown in FIG. 1, and 12A denotes a second-stage combinational circuit having a similar configuration to that of the first-stage. Here, the configuration of the combinational circuit 11A is shown as the representative, wherein plural stages of pull-down networks 21 and 23 are used as well as the inverter 22. Numeral 13A denotes an asynchronous signal control circuit for controlling the data transmission in the combinational circuits 11A and 12A. Here, a datapath circuit for activating a two-stage pipeline operation is shown as an example. However, the number of stages to be pipelined is not limited to only two.

In the asynchronous signal control circuit 13A, reference characters REQi, REQ2 and REQ3 denote request signals for initiating each stage of pipeline, EN1 through EN3 denote write enable signals to registers REG1 through REG3 respectively, which allow these registers to latch the input data, and ST1 and ST2 denote controlling signals inputted respectively to the combinational circuit 11A and 12A for controlling the active/inactive states thereof. Each of these controlling signals is referred to as an activation signal hereinafter.

Registers REG1 through REG3 are formed by a series of D flip-flops for storing the data inputted to and/or outputted from the combinational circuits 11A and 12A respectively.

It is to be noted that the signals REQi, REQ2 and REQ3 may be referred to as first, second and third request signals respectively, registers REG1 through REG3 may be referred to as first, second and third registers, and similarly the signals EN1, EN2 and EN3 also may be referred to first, second and third write enable signals, respectively.

Reference numeral 131 denotes a monitoring circuit for monitoring the operation of the first-stage combinational circuit 11A, which is composed of a delay circuit DL1, a NAND circuit NAND1 and an inverter INV1. By this monitoring circuit, the second request signal REQ2 is issued with respect to the second stage combinational circuit 12A after the time to be delayed at the delay circuit DL1 has passed from the moment that the write enable signal EN1 was issued (note that the wording "issue" means a state change of a signal as previously mentioned). The time to be delayed at the delay circuit DL1 is predetermined in such a manner as to be longer than the propagation delay time within the combinational circuit 11A. The request signal REQ2 finishes in accordance with the completion of the activation signal ST1 (note that the wording "completion" or "finish" means a signal state change from "1" to "0").

Reference numeral 132 is a monitoring circuit for monitoring the second-stage combinational circuit 12A, which is composed of a delay circuit DL2, a NAND circuit NAND2 and an inverter INV2, and performs a function just like the first monitoring circuit 131.

Reference characters NOR1 through NOR5 denote NOR gates, and C1 through C5 denote C-elements, each configured as shown in FIG. 11B. Namely, C-elements are respectively composed of pMOS transistors MP81 through MP86, and NMOS transistors MN81 through MN86. Considering the C-element, as shown in the truth table of FIG. 11C, when the two input data A1 and A2 are both "0", then "0" is outputted as the data Y, whereas "1" is outputted when A1 and A2 are both "1". If they do not coincide, then the previous data is maintained at the output.

It is to be noted that the C-element is disclosed in the following documents; G. M. Jacob et al., "A Fully Asynchronous Digital Signal Processor Using Self-Timed Circuits", IEEE Journal on Solid State Circuits, vol. 25, No.6, December 1990, pp. 1526–1537; and M. Shames et al., "A Comparison of CMOS Implementations of an Asynchronous Circuits Primitive: the C-element", International Symposium on Low Power Electron Devices, Monterey, Calif., 1996, pp. 93–96.

Figure 10:
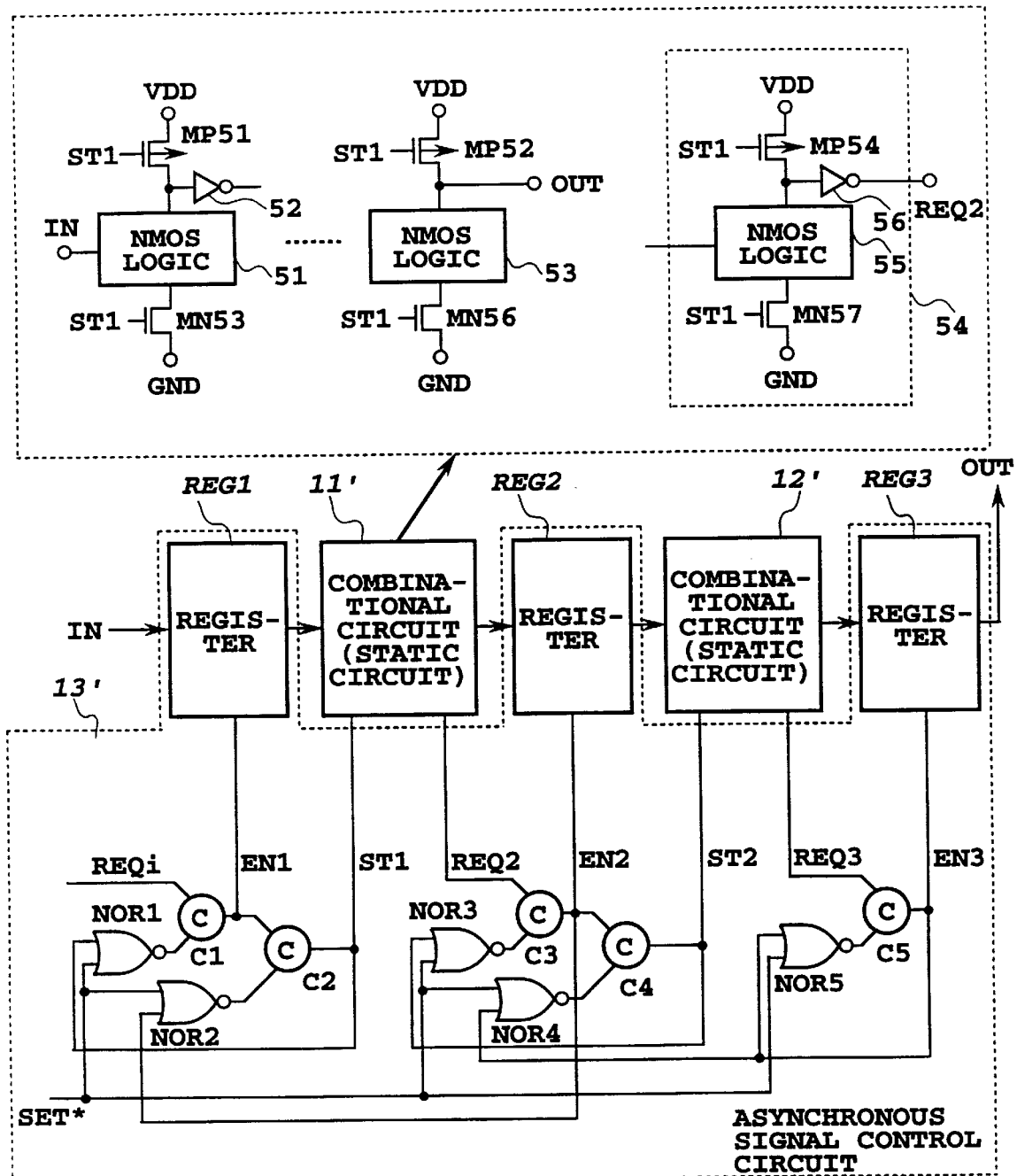
FIG. 10 is a circuit diagram showing a self-timed pipelined datapath system using a dynamic logic circuit therein as a combinational circuit.

Here, in order to facilitate the understanding of the present embodiment, a conventionally disclosed self-timed pipelined datapath system is explained with reference to FIG. 10, wherein dynamic combinational circuits 11' and 12' are shown. In the same figure, reference numeral 13' is an asynchronous signal control circuit. The members same as those in FIG. 4 have the same numbers.

Figure 9A:
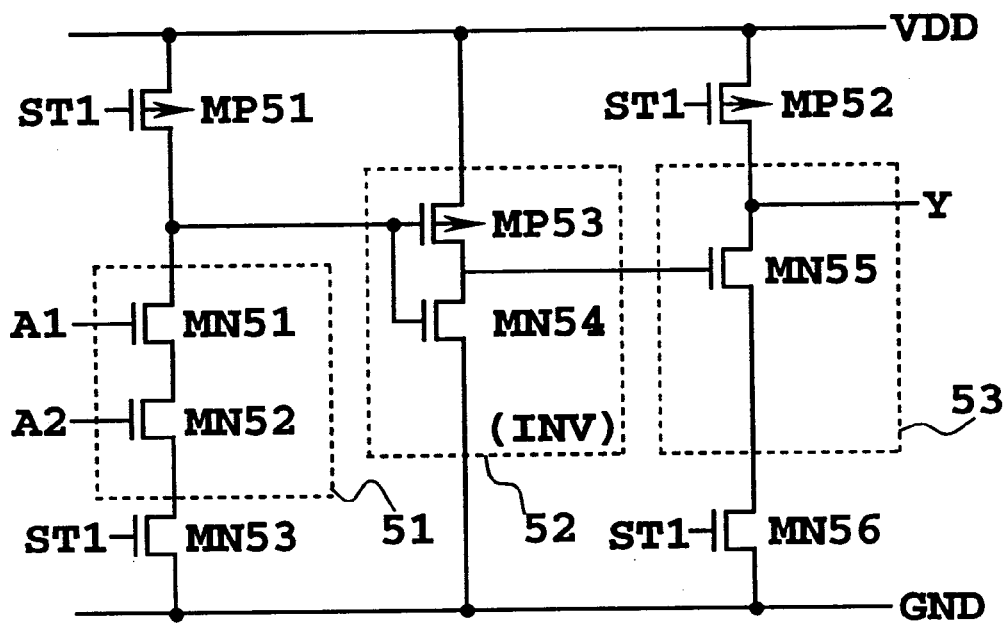
FIGS. 9A and 9B are circuit diagrams respectively showing conventional DOMINO logic circuits.
Figure 9B:
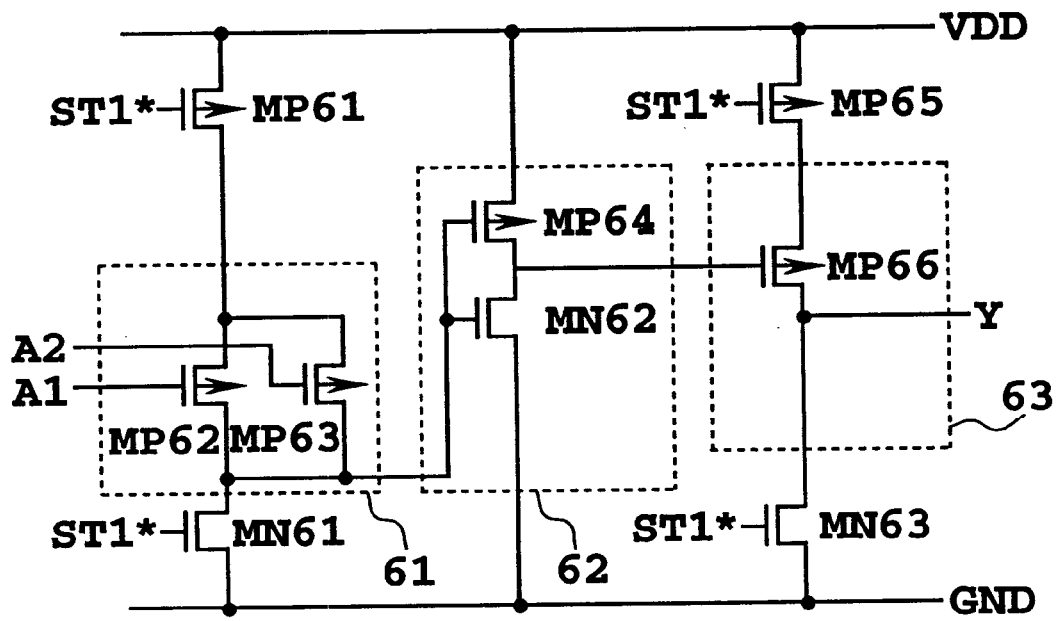
Figure 9C:
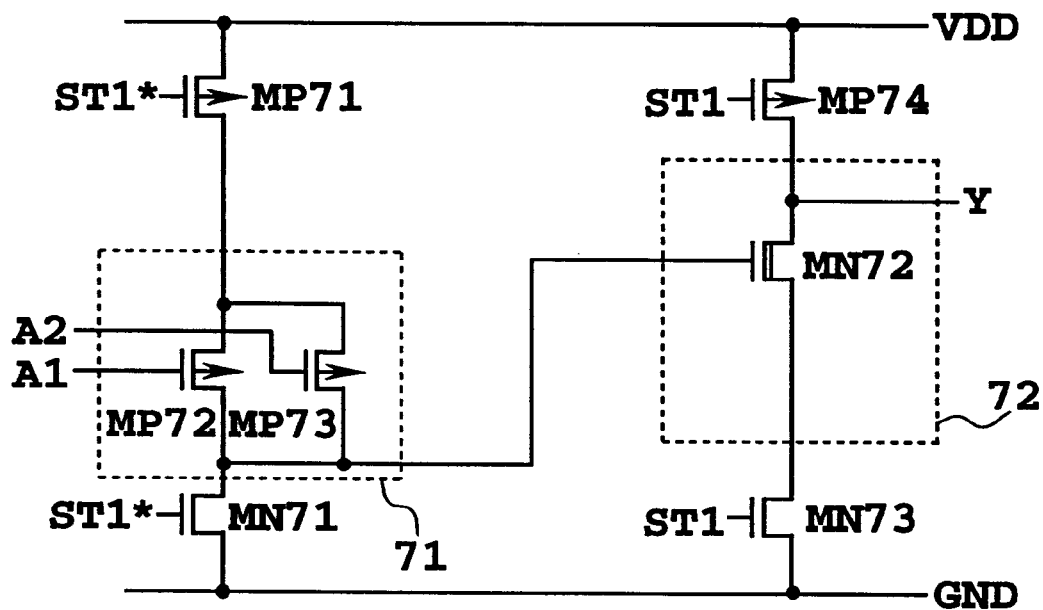
FIG. 9C is a circuit diagram showing a conventional npCMOS circuit.

The dynamic combinational circuit 11' (same as the combinational circuit 12') further comprises a monitoring circuit 54 for monitoring the completion of the operation in the combinational circuit 11' itself, in addition to the dynamic logic circuit shown in FIG. 9A. The second request signal outputted from the monitoring circuit 54 is set to "0" as the dynamic circuit is precharged with the "0" state of the activation signal ST1. On the other hand, when the activation signal ST1 becomes "1" to perform a logic operation, the request signal REQ2 is changed to "1" after a predetermined time lapse. The timing for changing the logic state of this REQ2 to "1" is determined by raising a signal to flag the completion of logic operation in the corresponding dynamic circuit. The signal is generated at the logic circuit 55 of the monitoring circuit 54 after a period of time required for logic operation. Note that MP54 denotes a pMOS transistor for precharging operation, MN57 denotes a nMOS transistor for discharging operation, and 56 denotes an inverter.

As explained above, the request signal REQ2 with respect to the subsequent-stage combinational circuit required to be issued after a propagation time of the current combinational circuit from the issue of the activation signal ST1, and finishes in accordance with the completion of the activation signal ST1.

Accordingly, in the present embodiment, the monitoring circuit 131 is provided as shown in FIG. 4, so as to readily generate the request signal REQ2 that satisfies the above condition. In the same manner, the monitoring circuit 132 is provided for generating the request signal REQ3.

Figure 5:
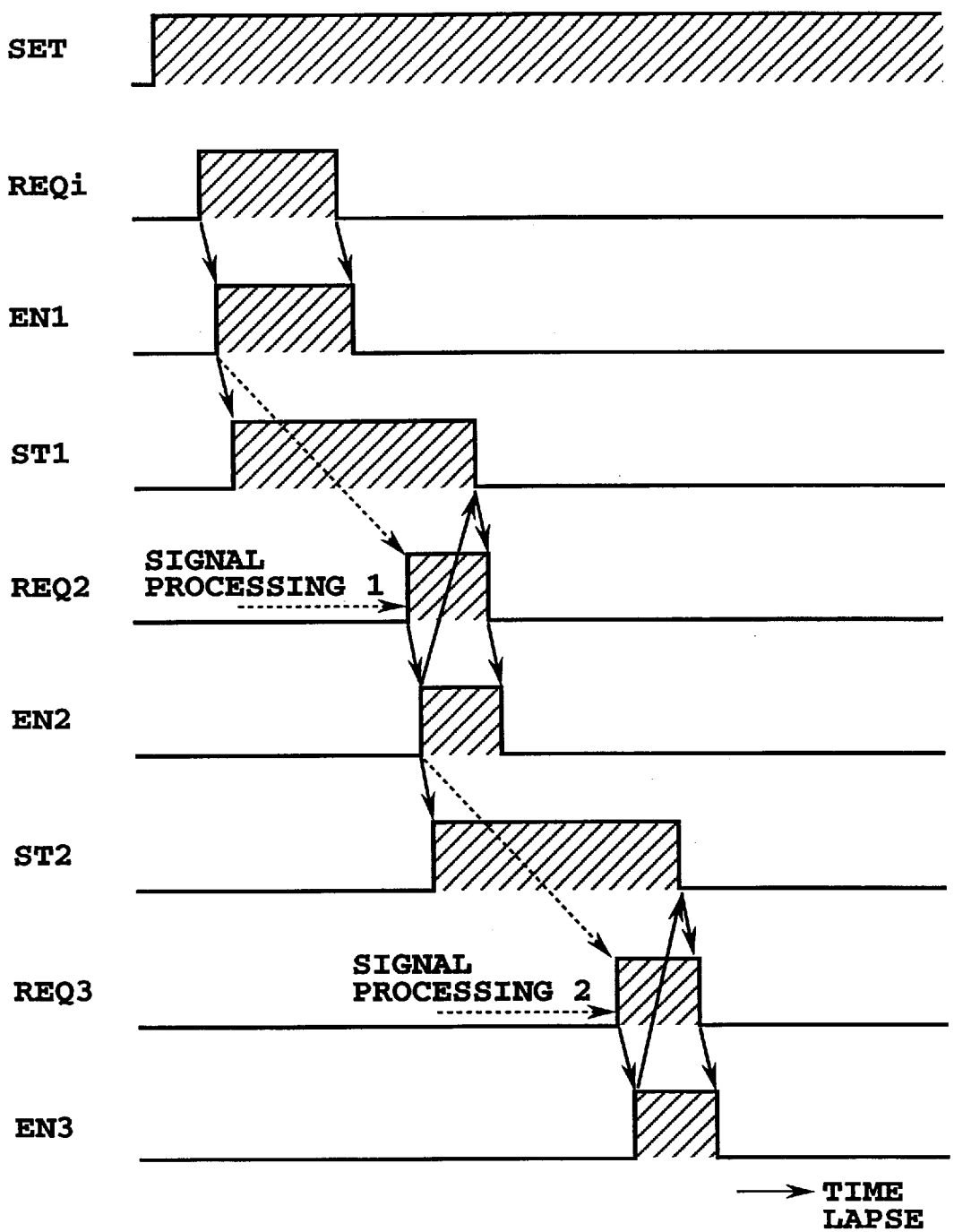
FIG. 5 is a timing chart for the operation of an asynchronous signal control circuit of FIG. 4.

The operation of this embodiment is now explained referring to FIG. 5.

First, the activation signals ST 1 and ST2 are in the "0" state, and the combinational circuits 11A and 12A are in the precharging state. In this situation, a SET signal is issued to put the asynchronous signal control circuit 13A in an active state. Then, in a state where all the data to be inputted to the register REG1 are ready, the request signal REQi is issued from outside. As a result, the write enable signal EN1 to be applied to the first-stage register (or simply first register) REG1, and the activation signal ST1 to be applied to the first-stage combinational circuit (hereinafter referred to just as "first combinational circuit") 11A are issued one after the other. In accordance with the issue of the write enable signal EN1, the input data is stored in the first register REG1. Further, when the activation signal ST1 is issued, the first combinational circuit 11A performs a logic operation (sampling operation).

Next, when a period of time which is longer than the propagation delay time in the first combinational circuit 11A has passed after the moment that the activation signal ST1 was issued, the monitoring circuit 131 issues a request signal REQ2 with respect to the second combinational circuit 12A. In accordance with the issue of the request signal REQ2, the write enable signal EN2 to be applied to the second-stage register (or simply second register) REG2, and the activation signal ST2 to be applied to the second-stage combinational circuit (hereinafter referred to just as "second combinational circuit") 12A are issued one after the other. Thereafter, due to the fact that the write enable signal EN2 has been issued, the data processed in the first combinational circuit 11A is stored in the second register REG2, and the activation signal ST1 to be applied to the first combinational circuit 11A finishes, and thereafter the second request signal REQ2 with respect to the second combinational circuit 12A also finishes. Due to the completion of the request signal REQ2, the write enable signal EN2 is also completed.

Here, due to the completion of the activation signal ST1, the combinational circuit 11A is put in a precharging state. On the other hand, because of the issue of the activation signal ST2, the combinational circuit 12A is put in an active state, and it processes the data outputted from the second register REG2. In other words, an active state is shifted from the first combinational circuit 11A to the second combinational circuit 12A.

Next, when a period of time which is longer than the propagation delay time in the second combinational circuit 12A has passed after the moment that the activation signal ST2 was issued, the monitoring circuit 132 issues a request signal REQ3 with respect to the third register REG3. In accordance with the issue of the request signal REQ3, the write enable signal EN3 to be applied to the third-stage register (or simply third register) REG3 is issued, and the data processed in the second combinational circuit 12A is stored in the register REG3. Further, due to the issue of the write enable signal EN3, the activation signal ST2 to be applied to the second combinational circuit 12A finishes, so that the second combinational circuit 12A is put in a precharging state, and thereafter the request signal REQ3 with respect to the third register REG3 also finishes. Due to the completion of the request signal REQ3, the write enable signal EN3 is also completed.

In this way, in accordance with the completion of the request signal REQ3, a series of pipelining operations is completed. Note that after the completion of the request signal REQi from outside, the asynchronous signal control circuit is put in a waiting state for another request signal.

As explained heretofore, the combinational circuits 11A and 12A are put in an active state from the precharging state only when the respective registers thereof receive data and need to process these data. When they are in a precharging state, a static leakage current is suppressed by the high-threshold MOS transistors MN23 and MN26 in the respective combinational circuits 11A and 12A. For this reason, power dissipation in the pipelined circuit for processing intermittently received data can be greatly reduced.

(Fifth Embodiment)

Figure 6:
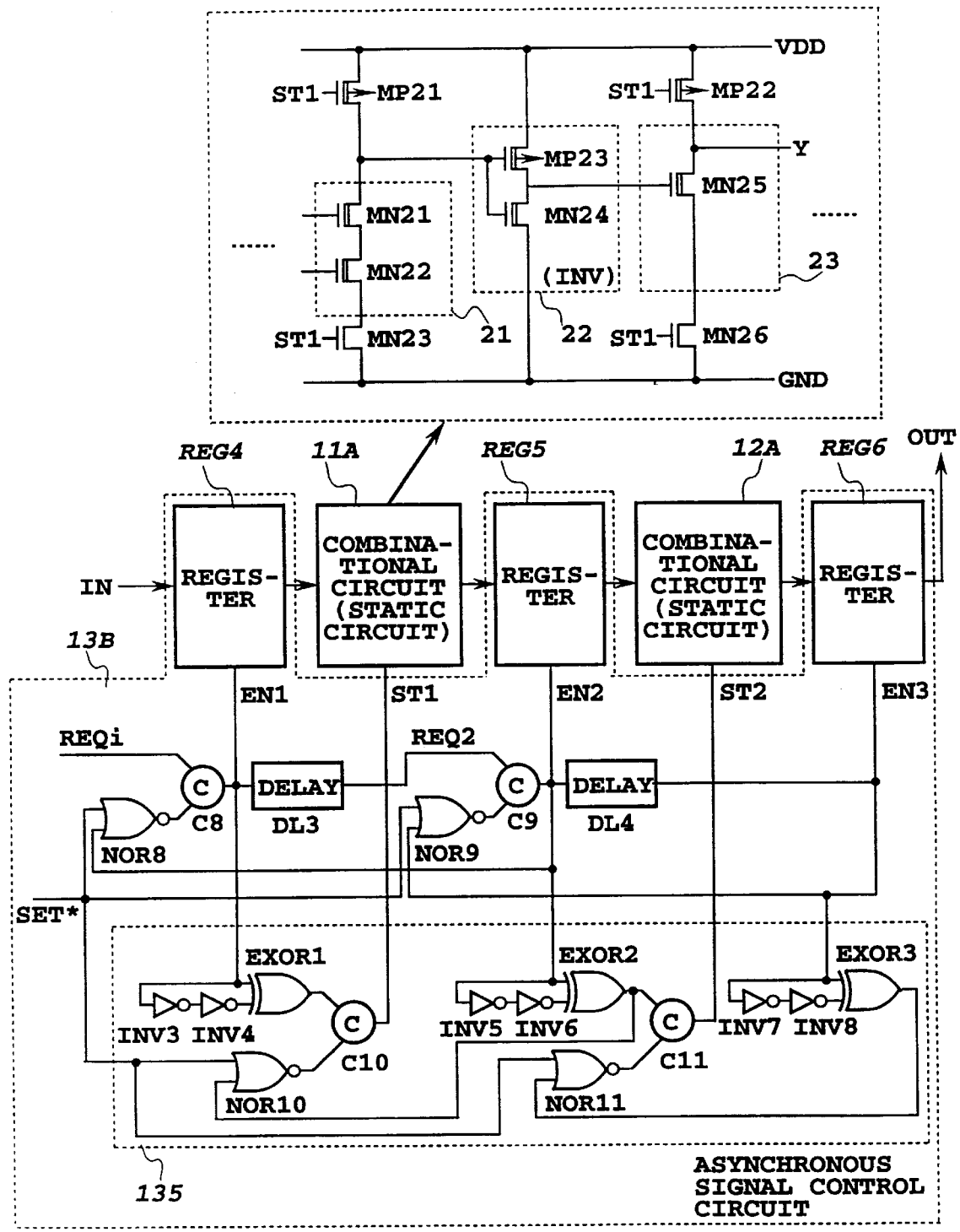
FIG. 6 is a circuit diagram showing a self-timed pipelined datapath system as a fifth embodiment according to the present invention.

FIG. 6 shows a configuration of the self-timed pipelined datapath system according to a fifth embodiment of the present invention. Although the datapath shown in this embodiment is a circuit in which two-stage pipelined operation adopting a two-phase handshaking protocol is performed, the number of stages is not limited to this. Note that the same elements as those in FIG. 4 have the same reference numbers. In short, the combinational circuits 11A and 12A are dynamic logic circuits as shown in FIG. 1. Reference numeral 13B denotes an asynchronous signal control circuit.

In this asynchronous signal control circuit 13B, REG4 through REG6 are registers configured by a series of double edge-triggered D flip-flops for storing the data inputted to and/or outputted from the combinational circuit 11A and 12A. The double edge-triggered D flip-flop latches data both at the rising and falling edges of the clock signal.

Figure 8:
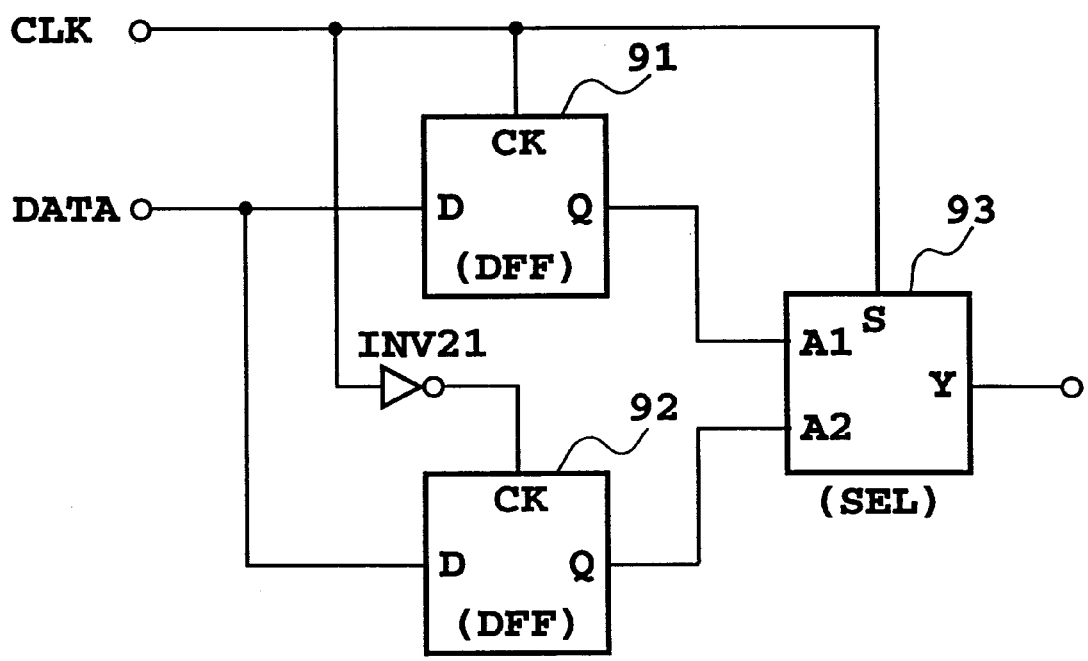
FIG. 8 is a circuit diagram showing a double edge-triggered flip-flop.

FIG. 8 shows an example of the configuration thereof. Reference numerals 91 and 92 denote respectively D flip-flops for latching the data inputted to the terminal D at the rising edge of the clock signal CLK. In the figure, numeral 93 denotes a selector that selects the outputted data from the flip-flop 91 when the clock signal is "1", whereas it selects the other outputted data from the flip-flop 92 when the clock signal is "0". INV 21 denotes an inverter.

In this circuit above, the data inputted to the flip-flop circuit 91 is latched at the rising edge of the clock signal CLK, and is selected at the selector 93 during the period in which the clock signal is "1", so as to be outputted therefrom. On the other hand, the data inputted to the flip-flop circuit 92 is latched at the falling edge of the clock signal CLK, and is selected at the selector 93 during the period in which the clock signal is "0", so as to be outputted therefrom.

Referring back to FIG. 6, reference characters DL3 and DL4 denote delay circuits, in which the delay time is set in such a way as to be longer than the propagation delay time in each of the combinational circuits 11A and 12A. Reference characters C8 through C11 denote C-elements, NOR8 through NOR11 denote NOR gates, EXOR1 through EXOR3 denote exclusive OR gates and INV3 through INV8 denote inverters.

Figure 12:
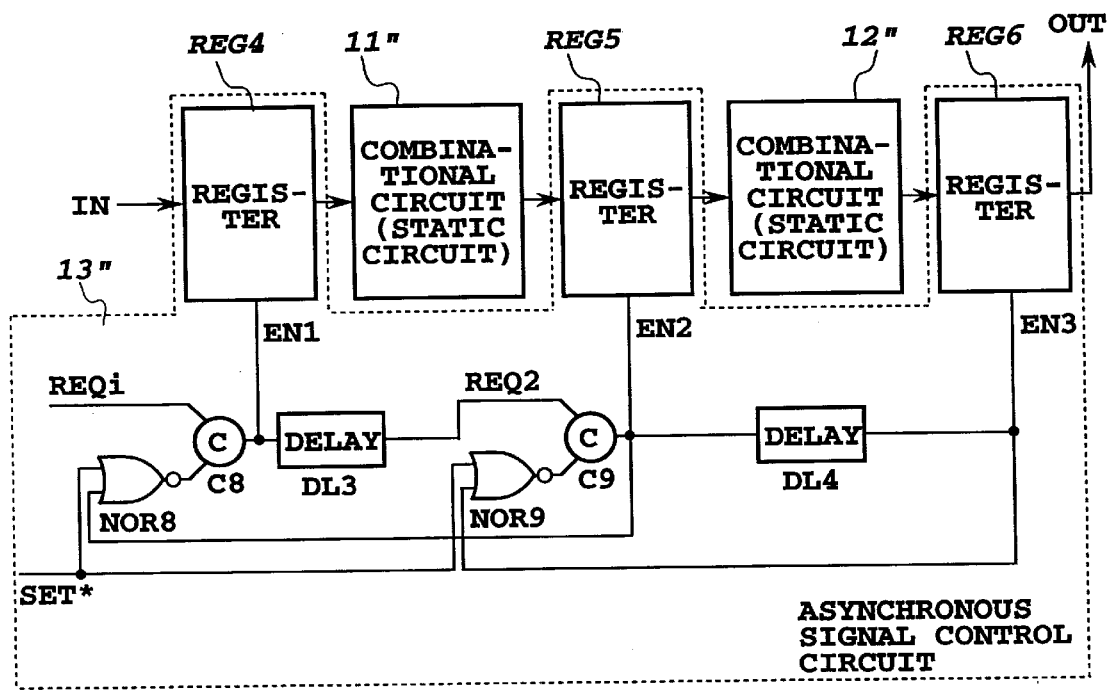
FIG. 12 is a circuit diagram showing a self-timed pipelined datapath system based on the two-phase handshaking protocol using a static circuit as the combinational circuit.

Here, in order to facilitate the understanding of the present embodiment, a conventionally disclosed self-timed pipelined datapath system adopting a two-phase handshaking protocol is explained, taking up the case in which static combinational circuits 11", and 12" are used as shown in FIG. 12. In FIG. 12, the elements in common with those in FIG. 6 have the same numbers. There are no activation signals provided for either of the combinational circuit 11", 12" from the asynchronous circuit 13".

In the two-phase handshaking protocol, any state change of the asynchronous signal is regarded as being the progress of an event, and the data processing is performed. Namely, the state change from "0" to "1" (meaning an issue) is regarded as being the same as the state change from "1" to "0" (meaning a completion), so that the level itself of the asynchronous signal has nothing to do with the progress of the event.

In such a simple asynchronous system, the combinational circuit 11", which is a static logic circuit, is always set in an active state, wherein in order to adjust the timing of the completion of the data process within the combinational circuit 11", and that of the state change of the asynchronous signal, the write enable signal EN1 to be applied to the first-stage register REG4 is inputted to the delay circuit DL3, and the write enable signal EN2 to the second-stage register REG 5 is then generated through the delay circuit DL3. The timing adjustment between the completion of the data process within the second combinational circuit 12" and that of the state change of the asynchronous signal is also executed in the same way.

However, in the embodiment shown in FIG. 6, it is required to switch the precharging operation and logic operation of the dynamic logic circuit shown in FIG. 1. For this reason, in this embodiment, an activation-signal-generating circuit 135 is added in order to detect the state change of the asynchronous signal and generate activation signals ST1 and ST2.

In this activation-signal-generating circuit 135, the state change of the write enable signal EN1 to the first register REG4 is detected as a signal pulse "1" by a delay circuit formed by two inverters INV3 and INV4 and an exclusive OR gate EXOR1. Further, the state change of the write enable signal EN2 to the second register REG5 is also detected as a signal pulse "1" by a delay circuit formed by two inverters INV5 and INV6 and an exclusive OR gate EXOR2. Still further, the state change of the write enable signal EN3 to the third register REG6 is also detected as a signal pulse "1" by a delay circuit formed by two inverters INV7 and INV8 and an exclusive OR gate EXOR3.

When there is no occurrence of a state change in the write enable signal EN1, the output of the exclusive OR gate EXOR1 is "0", and that of the NOR gate NOR10 is "1" (since the SET signal is "1" (in other words, the SET* signal in FIG. 6 is "0") and the output of the exclusive OR gate EXOR2 is "0"), so that the output of the C-element C10 is held unchanged.

In this state, when the write enable signal EN1 is issued, the output signal of the exclusive OR gate EXOR1 is changed to "1" temporally, the output of the C-element C10 becomes "1", and the activation signal ST1 is issued. Thereafter, although the output of the exclusive OR gate EXOR1 is immediately returned to "0", as the output "1" of the NOR gate NOR10 is held unchanged, the output of the C-element C10, namely the activation signal ST1, maintains its prior state, "1". After this operation, due to the issue of the write enable signal EN2, the output of the exclusive OR gate EXOR2 is changed temporally to "1", and the output of the NOR gate NOR10 is changed to "0", so that the output of the C-element C10, namely the activation signal ST1, becomes "0", which means the completion thereof. All these operations are similarly performed to the other activation signal ST2.

As explained heretofore, by the function of the activation-signal-generating circuit 135, during the period from the issue of the activation signal ST1 to the issue of the write enable signal EN2, the activation signal ST1 is maintained at "1". Further, during the period from the issue of the write enable signal EN2 to the issue of the write enable signal EN3, the activation signal ST2 is maintained at "1". All these operations are observed in the case that the request signal REQi is issued. However, the same operation can be observed even when the request signal REQi is completed, since the signal REQi changes its state thereby.

Figure 7:
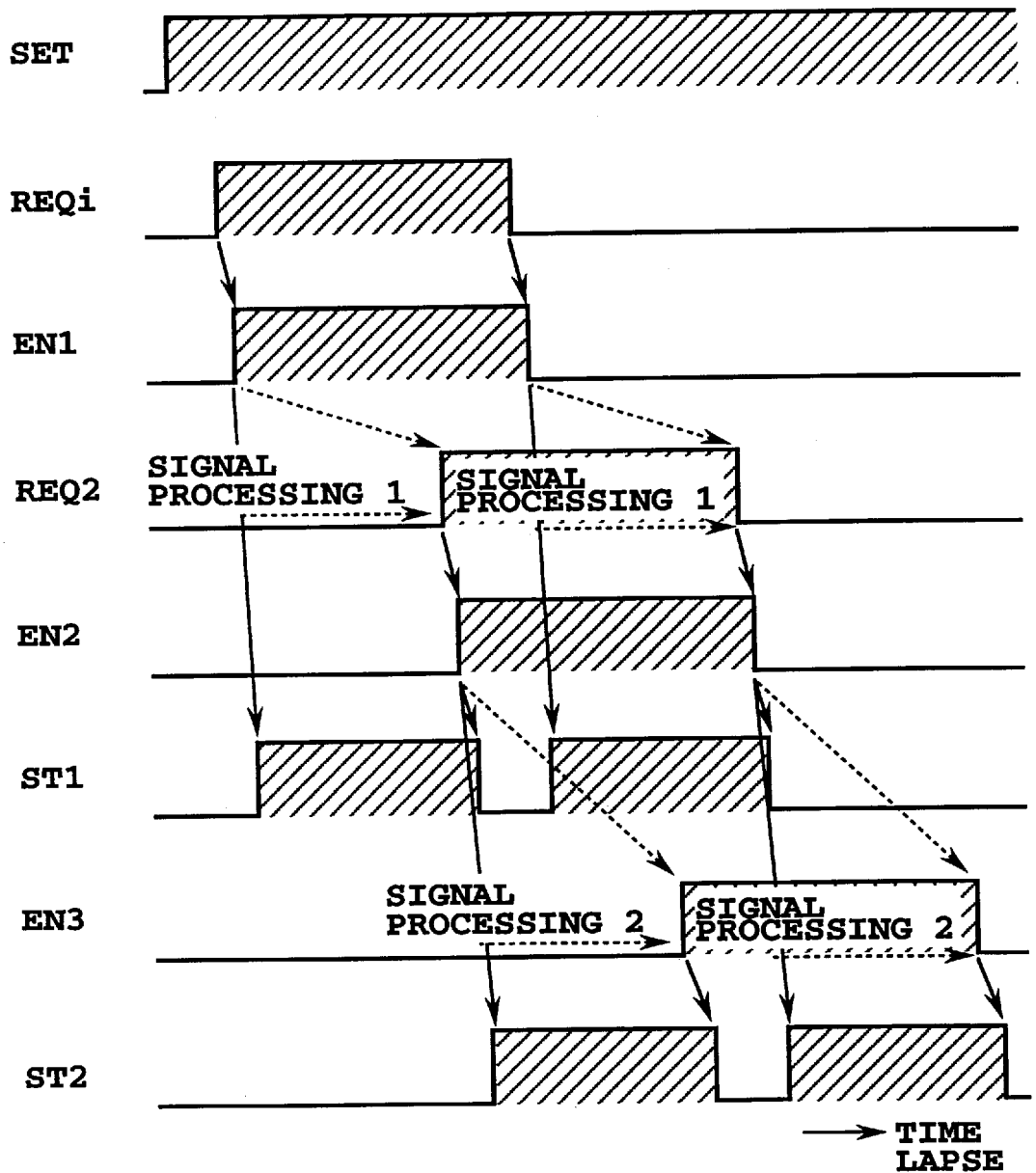
FIG. 7 is a timing chart for the operation of the asynchronous signal control circuit of FIG. 6.

The operation of this embodiment is now explained referring to FIG. 7.

First, the activation signals ST1 and ST2 are "0", and the combinational circuits 11A and 12A are both in a precharging state. In this situation, the SET signal is issued to set the asynchronous signal control circuit 13B in an active state. Then, in a state in which all the data to be inputted to the first register REG4 are ready, a request signal REQi is issued from outside. As a result, the write enable signal EN1 and the activation signal ST1 are issued one after the other. Thereafter, the inputted data is stored in the first register REG4 due to the issue of the write enable signal EN1. Further, due to the issue of the activation signal ST1, the first combinational circuit 11A is put in an active state and executes a logic processing operation on the data inputted thereto from the first register REG4.

Next, when a period of time which is longer than the propagation delay time in the first combinational circuit 11A has passed after the moment that the activation signal ST1 was issued, the request signal REQ2 is issued by the delay circuit DEL3, and the write enable signal EN2 and the activation signal ST2 are thereby issued. Due to the fact that the write enable signal EN2 has been issued, the data processed in the first combinational circuit 11A is stored in the second register REG5, and the activation signal ST1 is completed, whereby the first combinational circuit 11A is put in a precharging state. Further, due to the issue of the activation signal ST2, the second combinational circuit 12A executes a logic processing operation with respect to the data outputted from the second register REG5.

Next, when a period of time which is longer than the propagation delay time in the second combinational circuit 12A has passed after the moment that the write enable signal EN2 was issued, the write enable signal EN3 is issued by the delay circuit DEL4. Due to the issue of this write enable signal EN3, the data processed in the second combinational circuit 12A is stored in the third register REG6, and the activation signal ST2 to be applied to the second combinational circuit 12A finishes, so that the second combinational circuit 12A is put in a precharging state.

Note that if the request signal REQi is completed during the period that the write enable signal EN2 is in the "1" state, the both inputs to the C-element C8 become "0". By this function, the write enable signal EN1 as an output from the C-element C8 is completed, and a similar operation to the above is performed.

As shown above, the pipelining operation in the present embodiment is performed in response to the issue of the request signal REQi, as well as to the completion of the REQi signal. In this case, the combinational circuits 11A and 12A are released from the precharging operation thereof only when the data are ready to be inputted to the registers respectively connected to each of the input sides thereof, and need to be processed therein, whereas they are put in a precharging state when no data processing is needed, and a leakage current is thereby reduced. For this reason, the power dissipation of the pipelined datapath circuit, in which the intermittently inputted data are processed, can be reduced.

(Further Modifications)

In the self-timed pipelined datapath system shown in FIGS. 4 and 6, the dynamic logic circuit of FIG. 1 is adopted as the combinational circuits 11A and 12A. However, the operation of the circuit can be performed equally well in a case in which the combinational circuits 11A and 12A are provided with dynamic logic circuits of FIGS. 2 and 3. In these cases as well, when data to be processed are not ready, the activation signals ST1 and ST2 are in the "0" state, and thus a precharging or pre-discharging operation is executed However, since the MOS transistors for charging/discharging operations have high-threshold voltage, the leakage current can be suppressed, and the power dissipation can thereby be reduced.

Further, in the embodiments shown in FIGS. 4 and 6 above, if the asynchronous signal control circuits 13A, 13B are formed by high-threshold MOS transistors similar to the high-threshold transistors MN23, MN26 and MN43 for discharging operation and high-threshold transistors MP31, MP35 and MP41 for charging operation, which compose a dynamic logic circuit shown in FIGS. 1 through 3, then the power dissipation in these specific areas can be reduced. Note that since these asynchronous signal control circuits 13A and 13B are not expected to operate at a high speed, the decrease in the operating speed caused by the use of high-threshold MOS transistors will have little effect on the speed.

Furthermore, in the embodiments shown in FIGS. 1, 2 and 3, the high-threshold MOS transistors for charging or discharging operation can be configured as a DTMOS structure, each by connecting its body and gate (F. Assaderaghi, et al., "A dynamic threshold voltage MOSFET (DTMOS) for ultra-low voltage operation" IEDM Tech. Dig., 1994, pp. 809–812). By this arrangement, the threshold voltage level of each transistor can be maintained high when it is off, whereas when it is on it can be set somewhat lower than when it is off. As a result, the current driving ability of the transistor during its charging or discharging operation is improved, and the logic operation of the dynamic circuit with those transistors is thus accelerated.

Still further, the transistors adopted in all the aforementioned embodiments can be built on silicon-on-insulator (SOI) structure. As one example, in the embodiments shown in FIGS. 1, 2 and 3, the MOS transistors for charging or discharging operation can be replaced by SOI-type partially-depleted MOS transistors, whereas the MOS transistors for precharging or pre-discharging operation and MOS transistors configuring the pull-down network or the pull-up network can be replaced by SOI-type fully-depleted MOS transistors. Further, the MOS transistors for charging or discharging operation can be constructed as the above-mentioned DTMOS structure.

Figure 13A:
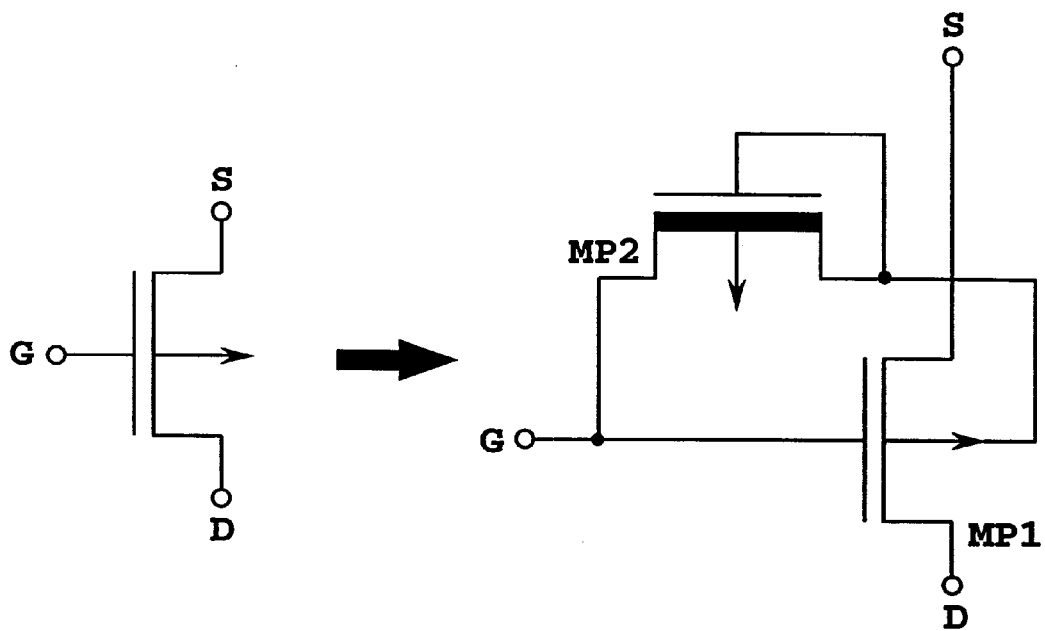
FIGS. 13A and 13B are circuit diagrams respectively explaining the case in which the pMOS transistors of FIGS. 1, 2 or 3 can be replaced by SOI-type transistors, and the case in which the nMOS transistors of FIGS. 1, 2 or 3 can be replaced also by SOI-type transistors.
Figure 13B:
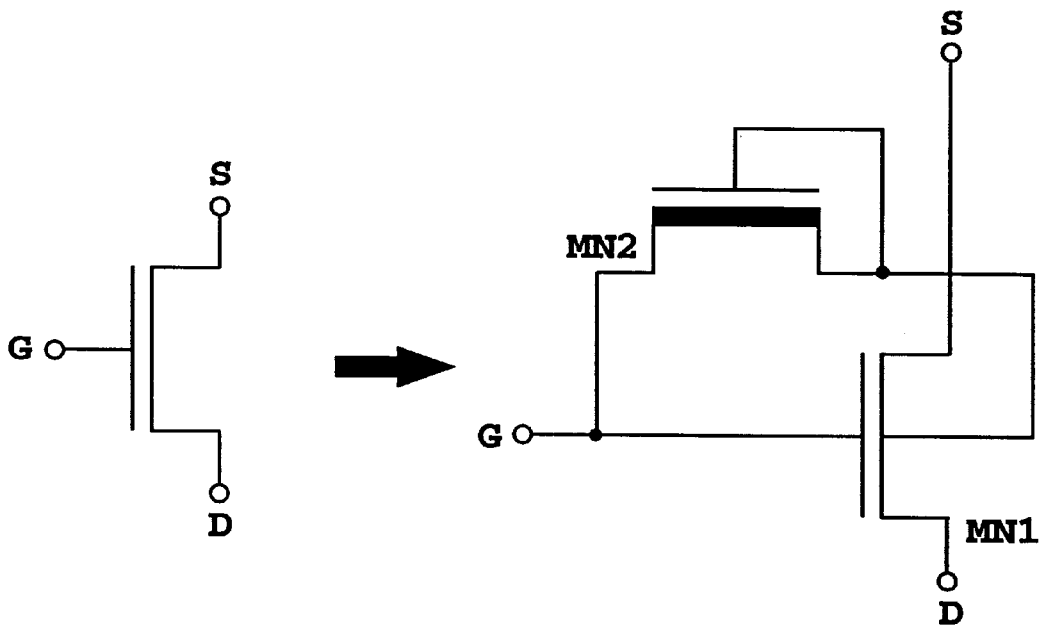

As a further embodiment adopting the SOI-type transistors, in the embodiments shown in FIGS. 1, 2 and 3, the MOS transistors for charging or discharging operation, namely pMOS and nMOS transistors can be replaced by the circuits shown in FIGS. 13A and 13B, where the transistors MP2 and MN2 are fully-depleted ones and the transistors MP1 and MN1 are partially-depleted ones.

The present invention has been described in detail with respect to preferred embodiments, and it will now be apparent from the foregoing to those skilled in the art that changes and modifications may be made without departing from the invention in its broader aspects, and it is the intention, therefore, in the appended claims to cover all such changes and modifications as fall within the true spirit of the invention.

What is claimed is:

1. A self-timed pipelined datapath system comprising:
   a pipelined datapath circuit including a plurality of data processing stages, each having;
      a combinational circuit for processing input data; said combinational circuit having a dynamic logic circuit comprising a plurality of sequentially coupled unit dynamic logic circuits, and
      a register connected to the input side of said combinational circuit; and
   an asynchronous signal control circuit that controls each of the registers in said pipelined datapath circuit in response to a request signal;
   wherein each of said plurality of unit dynamic logic circuits further comprises:
   a logic circuit portion composed of one or more than one low-threshold MOS transistors;
   a first MOS transistor for a precharging or a pre-discharging operation with respect to said logic circuit to perform; and
   a second high-threshold MOS transistor to enable said logic circuit a discharging or a charging operation;
   and wherein said asynchronous signal control circuit comprises signal generating means for controlling pre-charging and discharging operations and/or pre-discharging and charging operations of said combinational circuit in response to said request signal.

2. The self-timed pipelined datapath system as claimed in claim 1, wherein each of said plurality of unit dynamic logic circuits includes:
   a pull-down network composed of one or more than one low-threshold nMOS transistors as said logic circuit portion;
   a pMOS transistor for the pre-charging operation as said first MOS transistor; and
   a high-threshold nMOS transistor for a discharging operation as said second MOS transistor
   and wherein said multiple-stage unit dynamic logic circuits are configured as a DOMINO logic circuit by disposing a low-threshold CMOS inverter between the unit dynamic logic circuit at a preceding stage and the unit dynamic logic circuit at a succeeding stage.

3. The self-timed pipelined datapath system as claimed in claim 2, wherein said asynchronous signal control circuit is configured by high-threshold MOS transistors, and generates said activation signal with respect to the current combinational circuit from a write enable signal generated in response to the request signal with respect to the register preceding the current combinational circuit and another write enable signal generated in response to the request signal with respect to the register succeeding the current combinational circuit.

4. The self-timed pipelined datapath system as claimed in claim 1, wherein each of said plurality of unit dynamic logic circuits includes:
   a pull-up network composed of one or more than one low-threshold pMOS transistors as said logic circuit portion;
   a nMOS transistor for the pre-discharging operation as said first MOS transistor; and
   a high-threshold pMOS transistor for the charging operation as said second MOS transistor,
   and wherein said multiple-stage unit dynamic logic circuits are configured as a DOMINO logic circuit by disposing a low-threshold CMOS inverter between the unit dynamic logic circuit at a preceding stage and said unit dynamic logic circuit at a succeeding stage.

5. The self-timed pipelined datapath system as claimed in claim 4, wherein said asynchronous signal control circuit is configured by high-threshold MOS transistors, and generates said activation signal with respect to the current combinational circuit from a write enable signal generated in response to the request signal with respect to the register preceding the current combinational circuit and another write enable signal generated in response to the request signal with respect to the register succeeding the current combinational circuit.

6. The self-timed pipelined datapath system as claimed in claim 1, wherein said plurality of unit dynamic logic circuits comprise a first unit dynamic logic circuit and a second unit dynamic logic circuit, wherein said first unit dynamic logic circuit includes:
   a pull-up network composed of one or more than one low-threshold pMOS transistors as said logic circuit portion;
   an NMOS transistor for []a pre-discharging operation as said first MOS transistor; and
   a high-threshold pMOS transistor for a charging operation as said second MOS transistor,
   and said second unit dynamic logic circuit includes:
   a pull-down network composed of one or more than one low-threshold nMOS transistors as said logic circuit portion;
   a pMOS transistor for a pre-charging operation as said first MOS transistor; and
   a high-threshold nMOS transistor for a discharging operation as said second MOS transistor,
   and wherein said multiple-stage unit dynamic logic circuits are configured as an npCMOS logic circuit by interconnecting said first unit dynamic logic circuit and said second unit dynamic logic circuit alternately.

7. The self-timed pipelined datapath system as claimed in claim 6, wherein said asynchronous signal control circuit is configured by high-threshold MOS transistors, and generates said activation signal with respect to the current combinational circuit from a write enable signal generated in response to the request signal with respect to the register preceding the current combinational circuit and another write enable signal generated in response to the request signal with respect to the register succeeding the current combinational circuit.

8. A self-timed pipelined datapath system based on a two-phase handshaking protocol comprising:
   a pipelined datapath circuit including a plurality of data processing stages, each comprising:
      a combinational circuit for processing input data, said combinational circuit having a dynamic logic circuit comprising a plurality of sequentially coupled unit dynamic logic circuits, each comprising:
         a logic circuit portion composed of one or more low-threshold MOS transistors;
         a first MOS transistor for a pre-charging or a pre-discharging operation with respect to said logic circuit; and
         a second high-threshold MOS transistor to enable said logic circuit to perform a discharging or a charging operation; and
      a register connected to the input side of said combinational circuit, said register comprising at least one double-edge-triggered flip-flop; and
   an asynchronous signal control circuit that controls each of the registers in said pipelined datapath circuit in response to a request signal; and which comprises a signal generating means for controlling pre-charging and discharging operations and/or pre-discharging and charging operations of said combinational circuit in response to said request signal.

9. The self-timed pipelined datapath system as claimed in claim 8, wherein each of said plurality of unit dynamic logic circuits includes:
   a pull-down network composed of one or more than one low-threshold nMOS transistors as said logic circuit portion;
   a pMOS transistor for the pre-charging operation as said first MOS transistor; and
   a high-threshold nMOS transistor for a discharging operation as said second MOS transistor.
   and wherein said multiple-stage unit dynamic logic circuits are configured as a DOMINO logic circuit by disposing a low-threshold CMOS inverter between the unit dynamic logic circuit at a preceding stage and the unit dynamic logic circuit at a succeeding stage.

10. The self-timed pipelined datapath system as claimed in claim 9, wherein said asynchronous signal control circuit is configured by high-threshold MOS transistors, and generates an activation signal with respect to the current combinational circuit from a write enable signal generated in response to the request signal with respect to the register preceding the current combinational circuit and another write enable signal generated in response to the request signal with respect to the register succeeding the current combinational circuit.

11. The self-timed pipelined datapath system as claimed in claim 8, wherein each of said plurality of unit dynamic logic circuits includes:
   a pull-up network composed of one or more than one low-threshold pMOS transistors as said logic circuit portion;
   a nMOS transistor for the pre-discharging operation as said first MOS transistor; and
   a high-threshold pMOS transistor for the charging operation as said second MOS transistor,
   and wherein said multiple-stage unit dynamic logic circuits are configured as a DOMINO logic circuit by disposing a low-threshold CMOS inverter between the unit dynamic logic circuit at a preceding stage and said unit dynamic logic circuit at a succeeding stage.

12. The self-timed pipelined datapath system as claimed in claim 11, wherein said asynchronous signal control circuit is configured by high-threshold MOS transistors, and generates an activation signal with respect to the current combinational circuit from a write enable signal generated in response to the request signal with respect to the register preceding the current combinational circuit and another write enable signal generated in response to the request signal with respect to the register succeeding the current combinational circuit.

13. The self-timed pipelined datapath system as claimed in claim 8, wherein said plurality of unit dynamic logic circuits comprise a first unit dynamic logic circuit and a second unit dynamic logic circuit, wherein said first unit dynamic logic circuit includes:
   a pull-up network composed of one or more than one low-threshold pMOS transistors as said logic circuit portion;
   an NMOS transistor for a pre-discharging operation as said first MOS transistor; and
   a high-threshold pMOS transistor for a charging operation as said second MOS transistor,
   and said second unit dynamic logic circuit includes:
   a pull-down network composed of one or more than one low-threshold nMOS transistors as said logic circuit portion;
   a pMOS transistor for a pre-charging operation as said first MOS transistor; and
   a high-threshold nMOS transistor for a discharging operation as said second MOS transistor,
   and wherein said multiple-stage unit dynamic logic circuits are configured as an npCMOS logic circuit by interconnecting said first unit dynamic logic circuit and said second unit dynamic logic circuit alternately.

14. The self-timed pipelined datapath system as claimed in claim 13, wherein said asynchronous signal control circuit is configured by high-threshold MOS transistors, and generates an activation signal with respect to the current combinational circuit from a write enable signal generated in response to the request signal with respect to the register preceding the current combinational circuit and another write enable signal generated in response to the request signal with respect to the register succeeding the current combinational circuit.

15. The self-timed pipelined datapath system as claimed in claim 8, wherein said asynchronous signal control circuit is comprised of high-threshold MOS transistors and, for each data processing stage, generates an activation signal for the combinational circuit of a current data processing stage, a write enable signal for the register of the current data processing stage, and a request signal for controlling the next data processing stage,
   said activation signal of the current data processing stage being generated based on a logical combination of the write enable signal of the current data processing stage and the write enable signal of the next data processing stage, said write enable signal of the current data processing stage being generated based on a logical combination of the request signal from the previous data processing stage and the write enable signal of the next data processing stage, and said request signal for controlling the next data processing stage being generated as a delayed version of the write enable signal of the current data processing stage.

16. The self-timed pipelined datapath system as claimed in claim 15, wherein said signal generating means comprises an activation signal generating circuit comprising, for each data processing stage:

a write enable delay element, receiving as input the write enable signal of a current data processing stage;

an exclusive-OR gate, receiving as inputs the output of said write enable delay element and said write enable signal of the current data processing stage; and further combinational circuitry combining the output of said exclusive-OR gate with the output of the exclusive-OR gate corresponding to the next data processing stage, the output of the further combinational circuitry being output as said activation signal of the current data processing stage.

17. A self-timed pipelined datapath system comprising:

a) a plurality of data processing stages, each comprising:
   a combinational circuit for processing input data, said combinational circuit having a dynamic logic circuit comprising a plurality of sequentially coupled unit dynamic logic circuits, each comprising:
      a logic circuit portion composed of one or more low-threshold MOS transistors;
      a first MOS transistor for a pre-charging or pre-discharging operation, with respect to said logic circuit; and
      a second, high-threshold MOS transistor to enable said logic circuit to perform a discharging or a charging operation; and
   a register connected to an input side of said combinational circuit; and b) an asynchronous signal control circuit that controls each of the registers in said pipelined datapath circuit in response to an input request signal, comprised of high-threshold MOS transistors; and which, for each of said data processing stages, generates a write enable signal for the register of a current data processing stage, an activation signal for the combinational circuit of the current data processing stage, and a request signal for controlling the next data processing stage;

the asynchronous signal control circuit comprising:

signal generating means for controlling pre-charging and discharging operations and/or pre-discharging and charging operations in response to said input request signal, said signal generating means comprising, for each of said data processing stages:

a delay element having a delay of at least a processing time of said combinational circuit of a current data processing stage, the delay element receiving as an input the write enable signal of the current data processing stage; and request signal combinational logic that combines the output of the delay element with the activation signal of the current data processing stage and outputs the request signal for controlling the next data processing stage.

18. The self-timed pipelined datapath system as claimed in claim 17, said request signal combinational logic comprising:

a NAND gate receiving the output of said delay element and the activation signal of the current data processing stage; and an inverter, receiving the output of the NAND gate and outputting the request signal for controlling the next data processing stage.

19. The self-timed pipelined datapath system as claimed in claim 17, wherein:

said write enable signal of a current data processing stage is generated based on a logical combination of a request signal from the previous data processing stage, said activation signal of the current data processing stage, and a set signal for activating operation of the system; and said activation signal of the current data processing stage is generated based on a logical combination of said write enable signal of the current data processing stage, a write enable signal from the next data processing stage, and said set signal.

* * * * *